US006815996B1

(12) United States Patent
Hsiao

(10) Patent No.: US 6,815,996 B1
(45) Date of Patent: Nov. 9, 2004

(54) SWITCHED CAPACITOR CIRCUIT CAPABLE OF MINIMIZING CLOCK FEEDTHROUGH EFFECT IN A VOLTAGE CONTROLLED OSCILLATOR CIRCUIT

(75) Inventor: Chi-Ming Hsiao, Tai-Chung (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/605,095

(22) Filed: Sep. 9, 2003

Related U.S. Application Data

(63) Continuation-in-part of application No. 10/250,082, filed on Jun. 3, 2003.

(51) Int. Cl.$^7$ .............................. G06F 7/64; G06G 7/18
(52) U.S. Cl. .................... 327/337; 331/117 R; 331/179
(58) Field of Search ................................ 327/337, 392, 327/396, 401; 331/36 C, 117 R, 117 FE, 177 R, 179, 44

(56) References Cited

U.S. PATENT DOCUMENTS

| 5,053,723 | A | * | 10/1991 | Schemmel ................... 331/14 |
| 5,764,112 | A | * | 6/1998 | Bal et al. ................ 331/116 FE |
| 6,154,095 | A | * | 11/2000 | Shigemori et al. ............ 331/16 |
| 6,172,576 | B1 | * | 1/2001 | Endo et al. ............. 331/116 R |
| 6,633,202 | B2 | * | 10/2003 | Yang et al. .................... 331/57 |
| 6,661,301 | B2 | * | 12/2003 | Traub ..................... 331/117 R |

FOREIGN PATENT DOCUMENTS

JP          6-152244       *  5/1991

* cited by examiner

*Primary Examiner*—Tuan T. Lam
(74) *Attorney, Agent, or Firm*—Winston Hsu

(57) ABSTRACT

A switched capacitor circuit for use in a voltage controlled oscillator (VCO) capable of minimizing clock feedthrough effect and an undesired momentary frequency drift in the VCO output frequency when the switched capacitor circuit is shut off. By gradually switching the switched capacitor circuit from an on state to an off state the clock feedthrough effect can be minimized. When switching the switched capacitor circuit to an off state, the control signals are sequenced to shut the switch elements off in an order based on decreasing switch size. The smallest switch element can have a low-pass filter added to its control terminal to further decrease the clock feedthrough effect. The subthreshold and leakage currents passing through the largest switch elements are blocked by the use of an additional switch element to isolate the largest switch element.

29 Claims, 14 Drawing Sheets

US 6,815,996 B1

SWITCHED CAPACITOR CIRCUIT CAPABLE OF MINIMIZING CLOCK FEEDTHROUGH EFFECT IN A VOLTAGE CONTROLLED OSCILLATOR CIRCUIT

CROSS REFERENCE TO RELATED APPLICATIONS

This is a continuation-in-part of U.S. application Ser. No. 10/250,082, filed 03 Jun. 2003, and which is included herein by reference.

BACKGROUND OF INVENTION

1. Field of the Invention

The present invention relates to a switched capacitor circuit, and more particularly, to a switched capacitor circuit used in a voltage controlled oscillator (VCO) that can minimize the clock feedthrough effect thereby preventing a VCO frequency drift phenomenon during calibration and the synthesizer phase locking period.

2. Description of the Prior Art

A voltage controlled oscillator (VCO) is commonly used for frequency synthesis in wireless communication circuits. As Welland, et al. state in U.S. Pat. No. 6,226,506, wireless communication systems typically require frequency synthesis in both the receive path circuitry and the transmit path circuitry.

FIG. 1 shows a VCO circuit according to the prior art. An LC type VCO 10 used in a frequency synthesizer contains a resonator, and the basic resonant structure includes an inductor 12 connected between a first oscillator node OSC_P and a second oscillator node OSC_N. Connected in parallel with the inductor 12 is a continuously variable capacitor 14 and a plurality of discretely variable capacitors 16. The continuously variable capacitor 14 is used for fine-tuning a desired capacitance while the plurality of discretely variable capacitors 16 is used for coarse tuning. The resistive loss of the parallel combination of inductor and capacitors is compensated by a negative resistance generator 18 to sustain the oscillation.

Each discretely variable capacitor in the plurality of discretely variable capacitors 16 is made up of a switched capacitor circuit 20 and each switched capacitor circuit is controlled by an independent control signal (SW_1 to SW_N). Based on the control signal SW_N the switched capacitor circuit 20 can selectively connect or disconnect a capacitor 24 to the resonator of the VCO 10. Different on/off combinations of switched capacitor arrays results in a wider capacitance range of the LC type resonator and hence a wider VCO 10 oscillation frequency coverage.

FIG. 2 shows a switched capacitor circuit 20a according to the prior art. A capacitor 30 is connected between the first oscillator node OSC_P and a node A. A switch element 32 selectively connects node A to ground, and the switch element 32 is controlled by a control signal SW. When the switch element 32 is turned on, the capacitance associated with the capacitor 30 is added to the overall capacitance in the VCO 10 resonator. When the switch element 32 is turned off, the capacitance looking into the first oscillator node OSC_P is the series combination of the capacitor 30 and the off state capacitance associated with the switch element 32.

FIG. 3 shows a differential type switched capacitor circuit 20b according to the prior art. Differential implementations have much greater common-mode noise rejection and are widely used in high-speed integrated circuit environments. In the differential switched capacitor circuit 20b, a positive side capacitor 40 is connected between the first oscillator node OSC_P and a node A. A positive side switch element 42 selectively connects node A to ground. A negative side capacitor 44 is connected between the second oscillator node OSC_N and a node B. A negative side switch element 46 selectively connects node B to ground. The two switch elements 42, 46 are controlled by the same control signal SW. When the switch elements 42, 46 are turned on, the capacitance associated with the series combination of the positive and negative side capacitors 40, 44 is added to the overall capacitance in the VCO 10. When the switch elements 42, 46 are turned off, the differential input capacitance is the series combination of the positive and negative side capacitors 40, 44 and other switch parasitic capacitance. The overall input capacitance when all switch elements 42, 46 are turned off is lower than that when all switch elements 42, 46 are turned on.

FIG. 4 shows a second differential type switched capacitor circuit 20c according to the prior art. The second differential switched capacitor circuit 20c is comprised of the same components as the first differential switched capacitor circuit 20c and there is also a center switch element 48 used to lower the overall turn-on switch resistance connected between node A and node B. All three switch elements 42, 46, 48 are controlled by the same control signal SW. When the switch elements 42, 46, 48 are turned on, the capacitance associated with the series combination of the positive and negative side capacitors 40, 44 is added to the overall capacitance in the VCO 10. When the switch elements 42, 46, 48 are turned off, the differential input capacitance is the series combination of the positive and negative side capacitors 40, 44 and other switch parasitic capacitance. The overall input capacitance when all switch elements 42, 46, 48 are turned off is lower than that when all switch elements 42, 46, 48 are turned on.

Regardless of whether the single ended implementation shown in FIG. 2 or one of the differential implementations shown in FIG. 3 and FIG. 4 is used, when the switched capacitor circuit 20a, 20b, 20c is turned off, a momentary voltage step change occurs at node A (and in the case of the differential implementations also at node B). The momentary voltage step causes an undesired change in the overall capacitance, and ultimately, an undesired change in the VCO 10 frequency. Because NMOS switches are used in the examples shown in FIG. 2, FIG. 3, and FIG. 4, the momentary voltage step change is a voltage drop when the switch elements 32, 42, 46, 48 are turned off.

Using the single ended case shown in FIG. 2 as an example, when the switch element 32 is turned off, charge carriers are injected to the junction capacitance connected between the first terminal and the second terminal of the switch element 32. The injection produces an undesired voltage step change across the capacitive impedance and appears as a voltage drop at node A. This effect is known as clock feedthrough effect and appears as a feedthrough of the control signal SW from the control terminal of the switch element 32 to the first and second terminals of the switch element 32. When the switch element 32 is turned on, node A is connected to ground so the feedthrough of the control signal SW is of no consequence. However, when the switch element 32 is turned off, the feedthrough of the control signal SW causes a voltage step, in the form a voltage drop to appear at node A. Because of the dropped voltage at node A, the diode formed by the $N^+$ diffusion of switch element 32 and the P type substrate in the off state will be slightly forward biased. The voltage level at node A will spike low and then recover to ground potential as the slightly forward biased junction diode formed by the switch element 32 in the off state allows subthreshold and leakage currents to flow. The voltage drop and recovery at node A changes the loaded capacitance of the VCO 10 resonator and causes an undesired momentarily drift in the VCO 10 frequency.

When the differential switched capacitor circuit 20c shown in FIG. 4 switches off, it suffers from the same clock feedthrough effect problem at node A and at node B. The positive side node A has an undesired voltage step change caused by the clock feedthrough effect of both the positive side switch element 42 and the clock feedthrough effect of the center switch element 48. Similarly, the negative side node B has an undesired voltage step change caused by the clock feedthrough effect of both the negative side switch element 46 and the clock feedthrough effect of the center switch element 48. The voltage step change and recovery at node A and node B changes the loaded capacitance of the VCO 10 resonator and causes an undesired momentary drift in the VCO 10 frequency.

SUMMARY OF INVENTION

It is therefore a primary objective of the present invention to provide a switched capacitor circuit capable of minimizing the clock feedthrough effect, to solve the above-mentioned problem.

According to the present invention, a switched capacitor circuit capable of minimizing clock feedthrough effect is disclosed. The switched capacitor circuit comprises a first positive side switch element for selectively connecting a first positive side node to a third node depending upon a first control signal, wherein the first positive side node is connected to a positive side capacitor. A second positive side switch element is for selectively connecting the first positive side node to a second node depending upon a second control signal, and a third switch element is for selectively connecting the third node to the second node depending upon a third control signal. A sequence controller connected to the switch elements generates the first control signal, the second control signal, and the third control signal.

According to the present invention, a method is disclosed for minimizing clock feedthrough effect when switching off a switched capacitor circuit. The method comprises the following steps: (a) Disconnecting a first positive side node from a third node through a first positive side switch element. (b) Disconnecting the first positive side node from a second node through a second positive switch element. (c) Disconnecting the third node from the second node through a third positive side switch element. Wherein, the first positive side node is connected to a positive side capacitor and the sequence of steps (b) and (c) are interchangeable.

It is an advantage of the present invention that by switching off the switch elements sequentially in an order of decreasing size, the switched capacitor circuit is gradually switched off to minimize the clock feedthrough effect and therefore the undesired drift of the VCO 10 frequency.

It is a further advantage of the present invention that by using a third switch element to isolate the largest switch elements from a ground or power node, the subthreshold and leakage currents passing through the largest switch elements once they are switched off are blocked and the VCO 10 stabilizes to a steady state frequency at a much lower rate.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
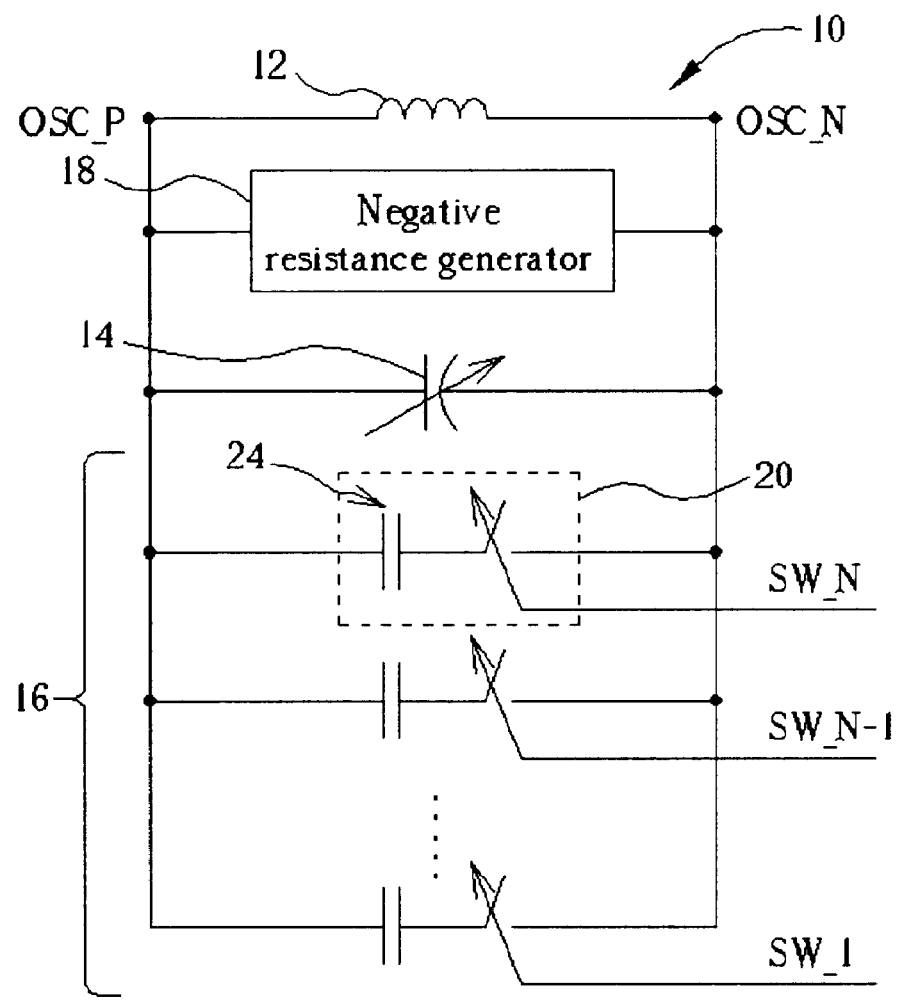
FIG. 1 is a schematic diagram of a typical Voltage Controlled Oscillator (VCO) circuit used in a frequency synthesizer according to the prior art.
Figure 2:
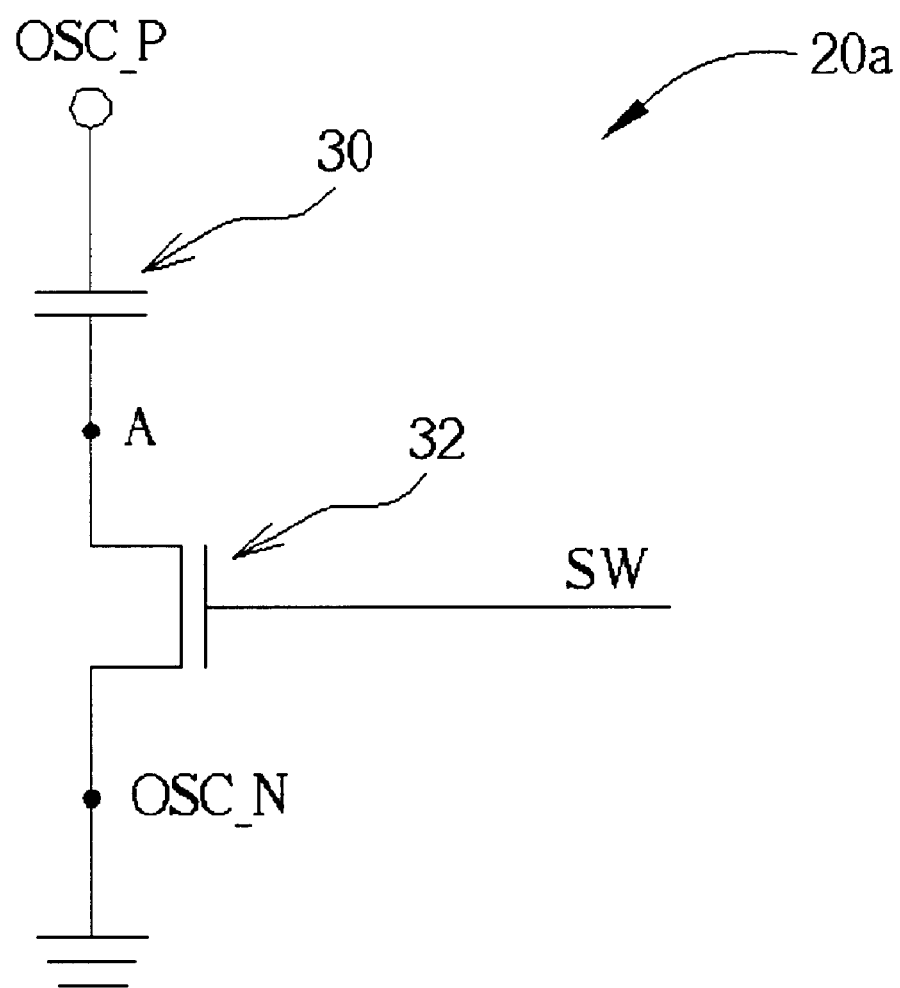
FIG. 2 is a switched capacitor circuit used in the VCO of FIG. 1 according to the prior art.
Figure 3:
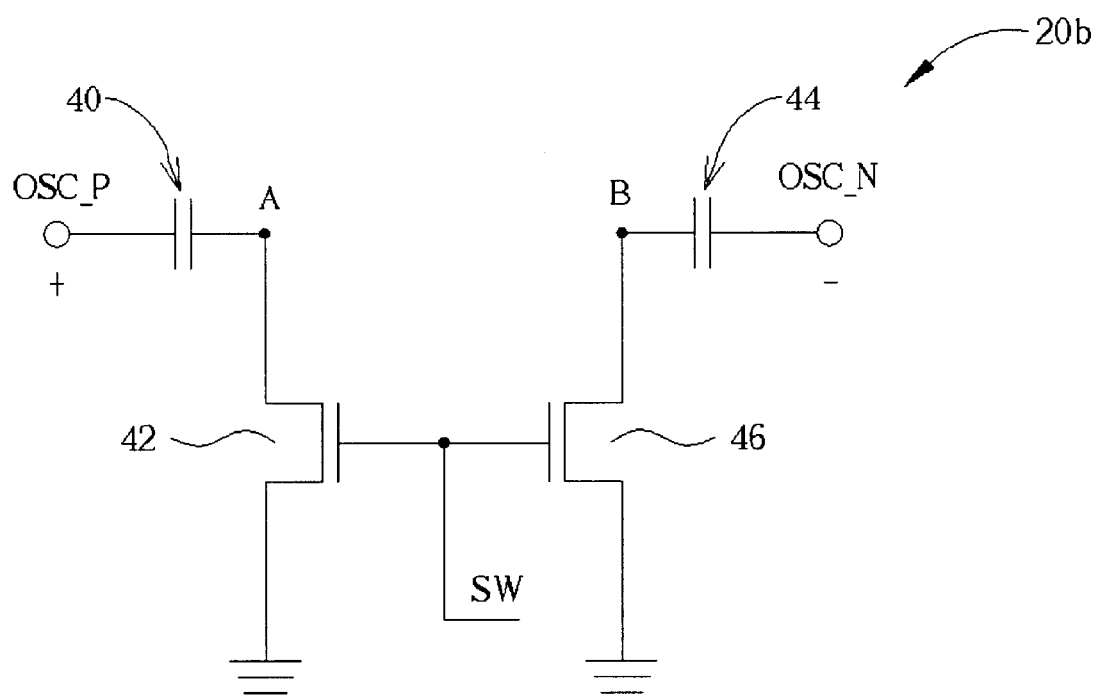
FIG. 3 is a differential type switched capacitor circuit used in the VCO of FIG. 1 according to the prior art.
Figure 4:
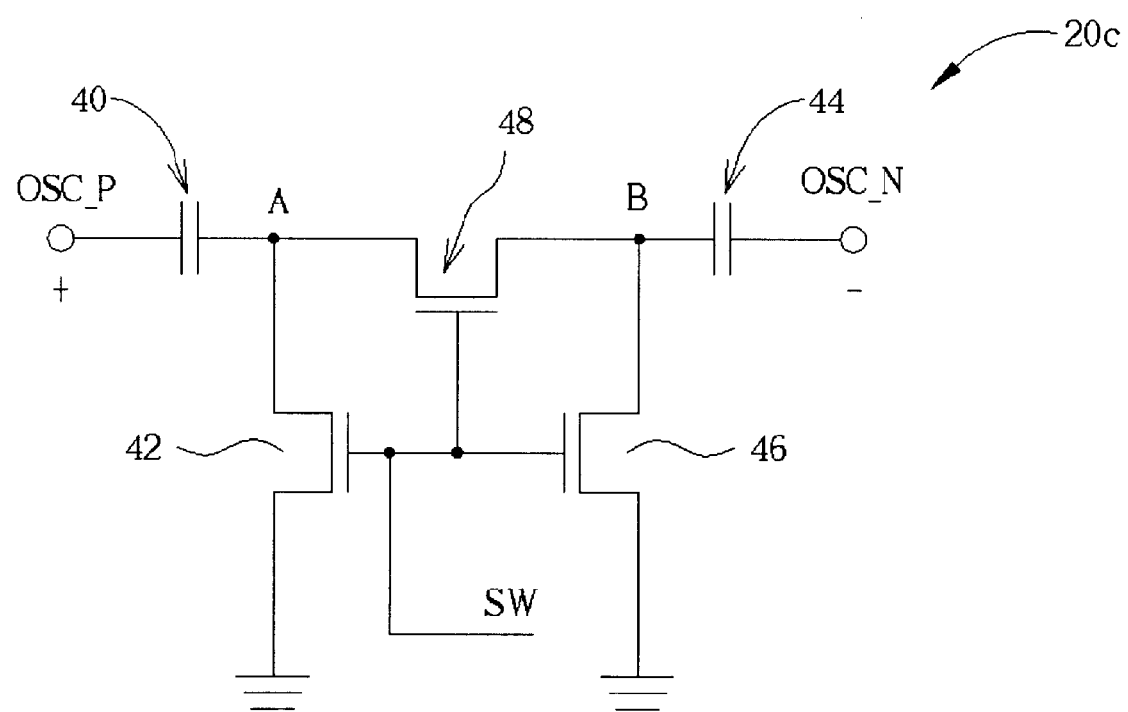
FIG. 4 is the differential type switched capacitor circuit of FIG. 3 with the addition of a center switch element.
Figure 5:
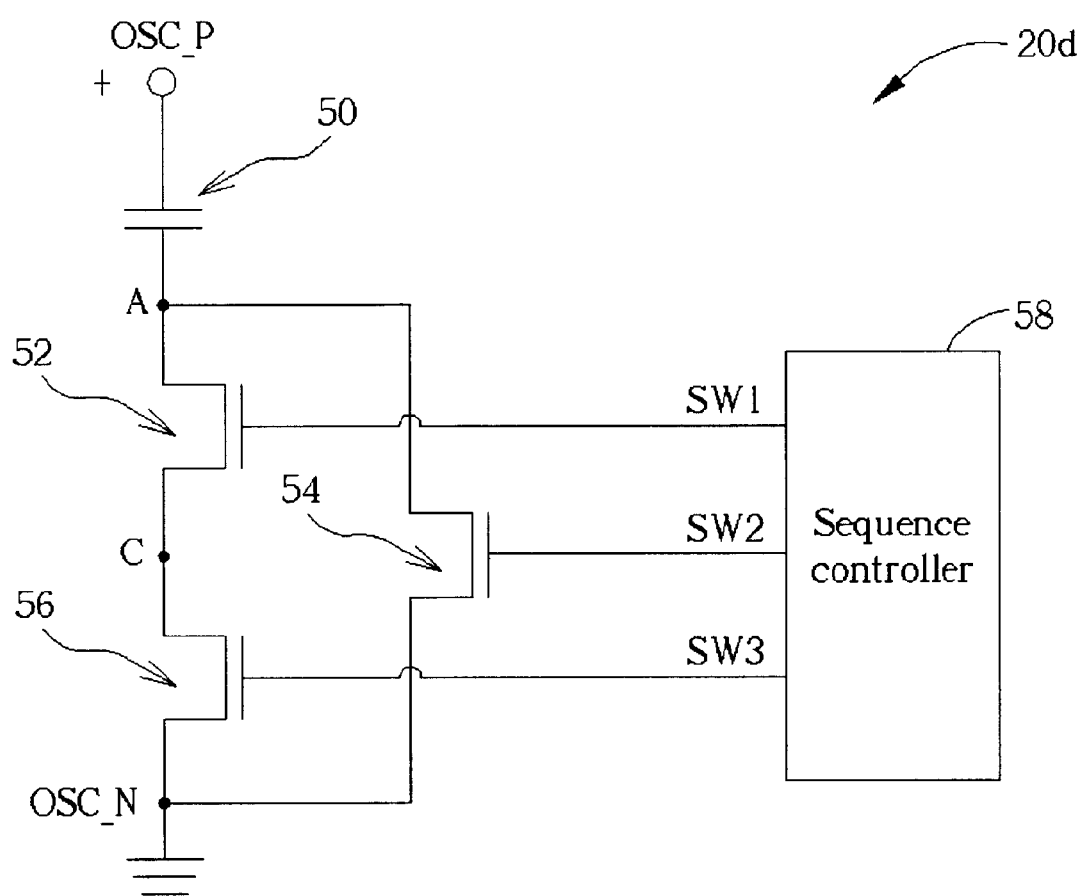
FIG. 5 is a first embodiment switched capacitor circuit according to the present invention.

FIG. 5 shows a first embodiment switched capacitor circuit 20d according to the present invention. In FIG. 5, the switched capacitor circuit 20d comprises a capacitor 50, a first switch element 52, a second switch element 54, a third switch element 56, and a sequence controller 58. In the first embodiment, the switch elements are NMOS transistors, the first switch element 52 being larger than the second switch element 54, and the second switch element 54 being larger than the third switch element 56. The capacitor 50 is connected between the first oscillator node OSC_P and a node A. The first switch element 52 selectively connects node A to node C depending on a first control signal SW1. The second switch element 54 selectively connects node A to the second oscillator node OSC_N, which is connected to ground, depending on a second control signal SW2. The third switch element 56 selectively connects node C to the second oscillator node OSC_N depending on a third control signal SW3. The sequence controller 58 generates the first, second, and third control signals SW1, SW2, SW3. As an alternative embodiment, the switch elements can be implemented as PMOS transistors, wherein the oscillator node OSC_N is a VCC power supply node. For this alternative embodiment, the polarity of control signals is reversed.

Figure 6:
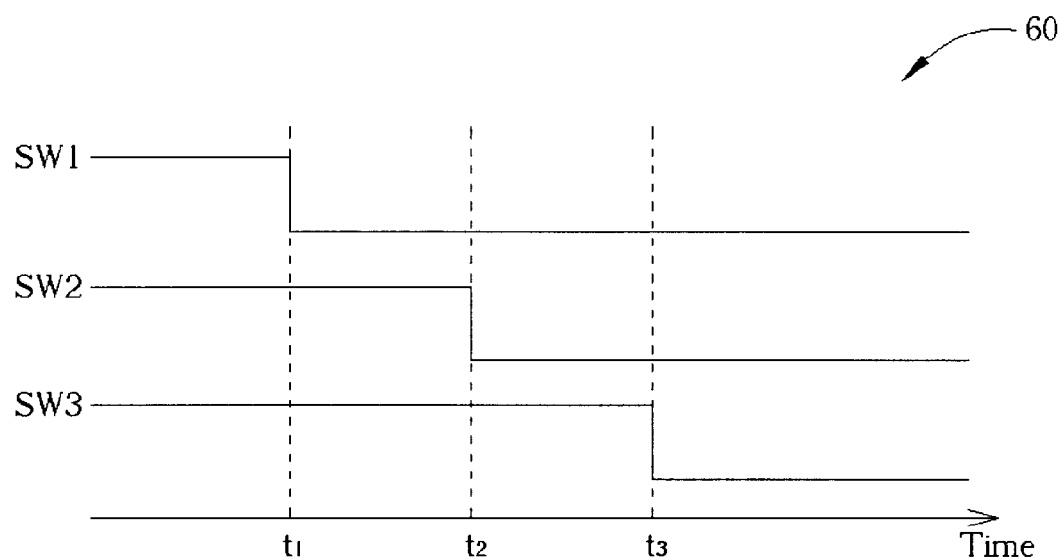
FIG. 6 is a first time domain plot of the control signals generated by the sequence controller of FIG. 5.

FIG. 6 shows a first time domain plot 60 of the control signals generated by the sequence controller 58. In order to gradually switch the switched capacitor circuit 20d to an off state, the sequence controller 58 ensures that the switch elements 52, 54, 56 are switched off in decreasing order based on switch size. Because the first switch element 52 is larger than the second switch element 54, the first switch element 52 is first switched off at time $t_1$. Because the second switch element 54 is larger than the third switch element 56, the second switch element 54 is next switched off at time $t_2$. Finally, at time $t_3$, the third switch element 56 is switched off. Since the amount of voltage change at node A due to the clock feedthrough effect depends on the parasitic capacitance ratio of control terminal (gate) to first terminal (drain) and first terminal to second terminal (source) capacitance, the smaller the control terminal to first terminal capacitance, the smaller the voltage change due to the feedthrough of the control signal switching from high to low. The present invention takes advantage of this fact because the larger switch element 52 with a larger voltage drop due to the clock feedthrough effect is switched off first. Until the second switch element 54 is switched off, node A is connected to ground and the clock feedthrough effect due to the first switch element 52 is not a concern. If the second switch element 54 is made sufficiently small, the clock feedthrough effect for this switch changing from the on to off state can be made negligible.

However, when the second switch element 54 is switched off, node A still experiences a slightly negative voltage drop due to the clock feedthrough effect. Because of the existence of subthreshold and leakage currents through the switch elements 52, 54, 56, the node A potential eventually returns to ground. The larger the switch element, the larger the subtheshold and leakage currents. The purpose of the third switch element 56 is to isolate the first switch element 52, which is the largest switch element, from ground to delay the node A returning to ground potential. By delaying the voltage at node A return to ground potential during the synthesizer phase locking period, node A remains at a slightly negative but constant voltage potential for a longer period of time. The frequency synthesizer can therefore lock the VCO 10 frequency faster.

Figure 7:
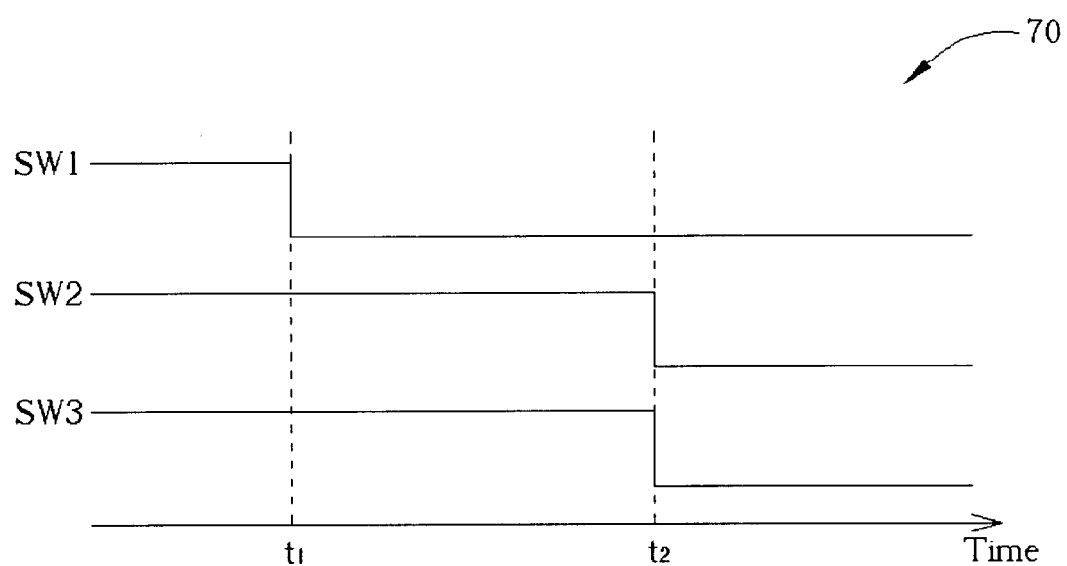
FIG. 7 is a second time domain plot of the control signals generated by the sequence controller of FIG. 5.

FIG. 7 shows a second time domain plot 70 of the control signals generated by the sequence controller 58. In order to gradually switch the switched capacitor circuit 20d to an off state, the sequence controller 58 ensures that the first switch element 52 is switched off first at time $t_1$. The third switch element 56 is shut off at the same time as the second switch element 54 at time $t_2$.

Figure 8:
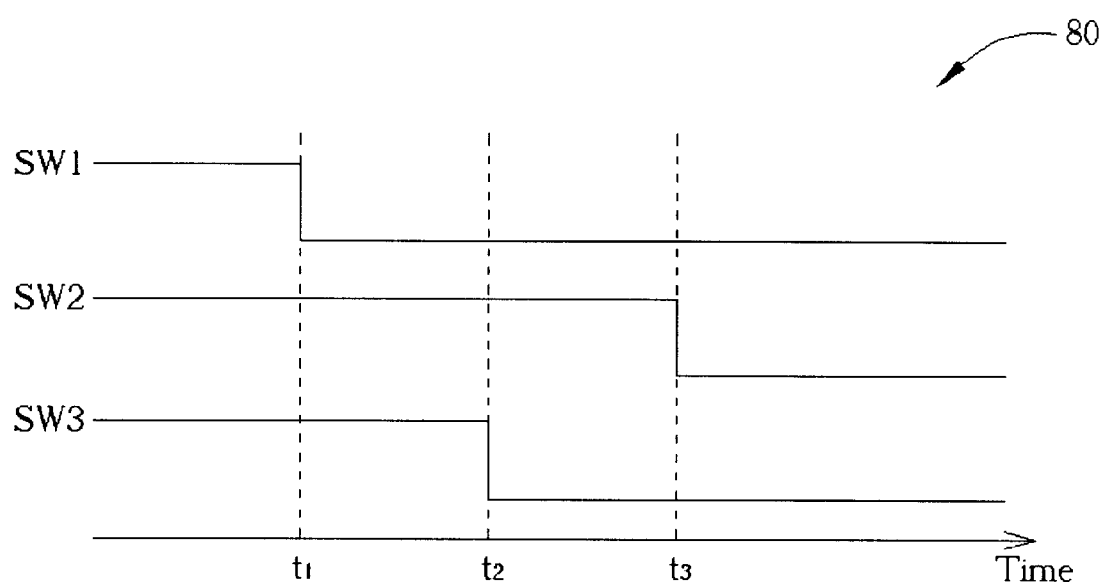
FIG. 8 is a third time domain plot of the control signals generated by the sequence controller of FIG. 5.

FIG. 8 shows a third time domain plot 80 of the control signals generated by the sequence controller 58. In order to gradually switch the switched capacitor circuit 20d to an off state, the sequence controller 58 again ensures that the first switch element 52 is switched off first at time $t_1$. However, to further prevent subtheshold and leakage currents from passing through the first switch element 52 when node A is not connected to ground, the third switch element 56 is switched off next at time $t_2$. After the first switch element 52 has been disconnected from ground by the third switch element 56, the second switch element 54 is switched off at time $t_3$.

Figure 9:
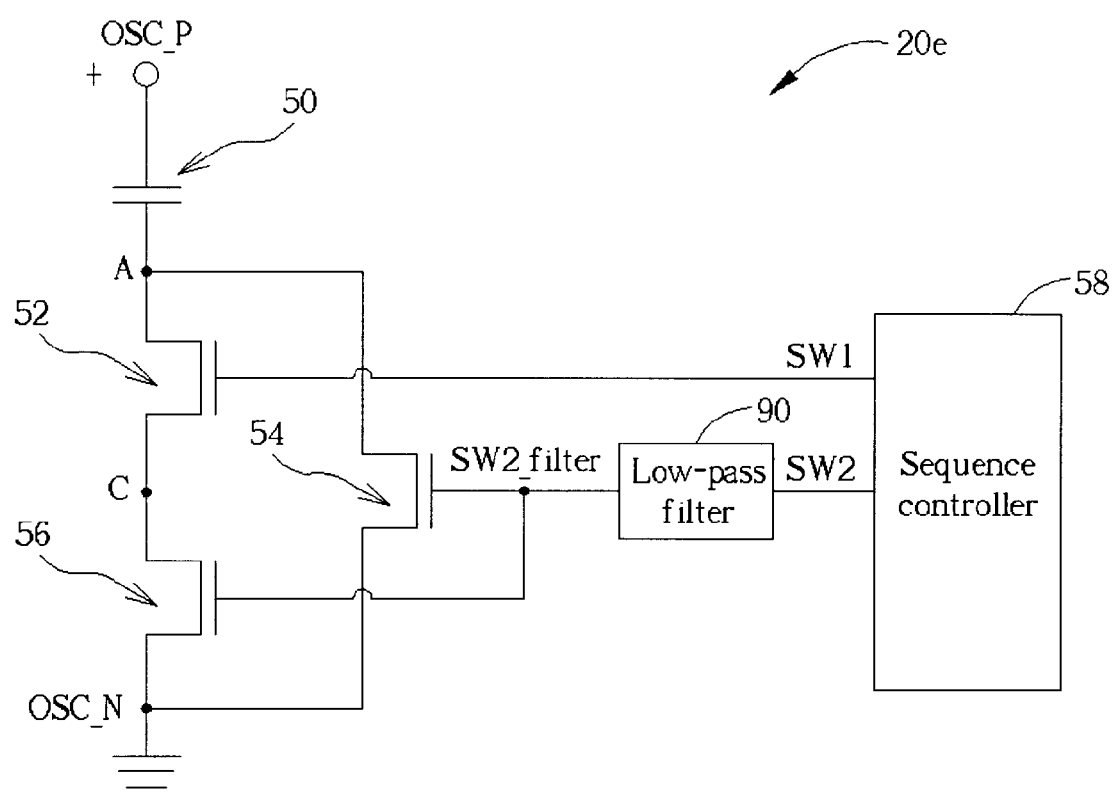
FIG. 9 is a second embodiment switched capacitor circuit according to the present invention.

FIG. 9 shows a second embodiment switched capacitor circuit 20e according to the present invention. FIG. 9 comprises the same components as the first embodiment switched capacitor circuit 20d shown in FIG. 5 with the addition of a low-pass filter 90 for making the second and third switch elements 54, 56 gradually switch off. The first switch element 52 is controlled by the first control signal SW1, while the second and third switch elements 54, 56 are both controlled by the output of the low-pass filter 90 (SW2_filter), which is a low-pass filtered version of the second control signal SW2. It should also be noted that, in FIG. 5, a low pass filter could also be added at the second and/or third switch control signals, SW2 and SW3.

Figure 10:
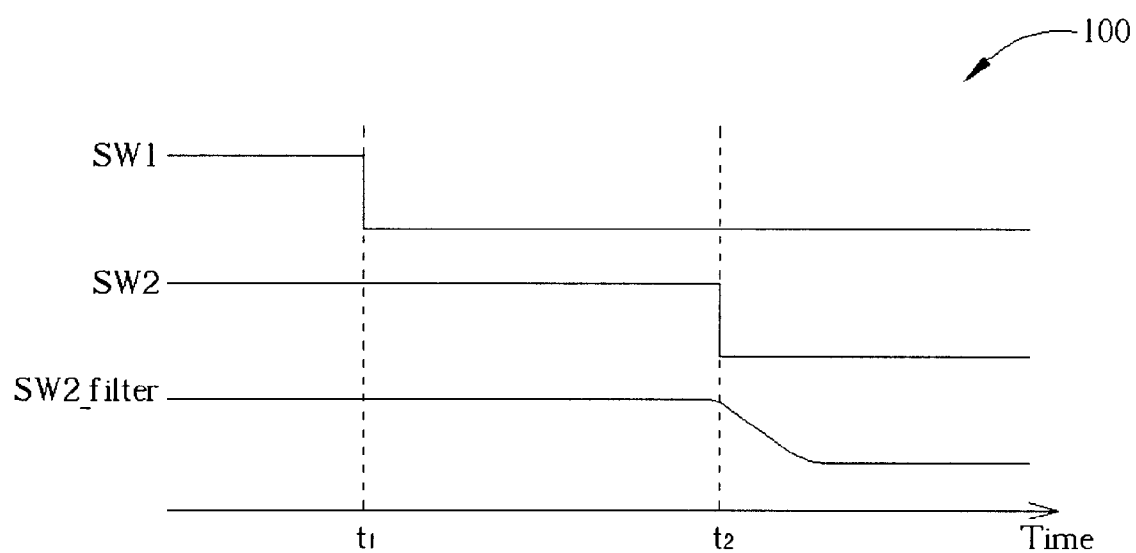
FIG. 10 is a time domain plot of the control signals generated by the sequence controller of FIG. 9.

FIG. 10 shows a time domain plot 100 of the control signals generated by the sequence controller 58. In order to gradually switch the switched capacitor circuit 20e to an off state, the sequence controller 58 ensures that the first switch element 52 is switched off first at time $t_1$. The low-pass filter 90 causes the signal SW2_filter, used to control the second and third switch elements 54, 56, to gradually change from a logic high to a logic low and in this way minimize the voltage step change seen at node A. Because the second switch element 54 is gradually switched off, node A is gradually disconnected from ground. As the second switch element 54 is gradually switched off, during a period of delay time there exists a conduction path of the switch element 54, with an increasing resistance as time advances, to ground to minimize the clock feedthrough effect. In contrast to the prior art, the present invention does not forward bias the parasitic diode formed by the switch element 54 in the off state. The clock feedthrough effect at each moment of time is reduced. As shown in FIG. 9, the third switch element is also controlled by the output of the low-pass filter 90 (SW2_filter) to minimize the clock feedthrough effect of the third switch element itself. It should also be noted that the third switch element could also be directly controlled by the second control signal SW2 and does not necessarily need to have its control signal low-pass filtered.

Figure 11:
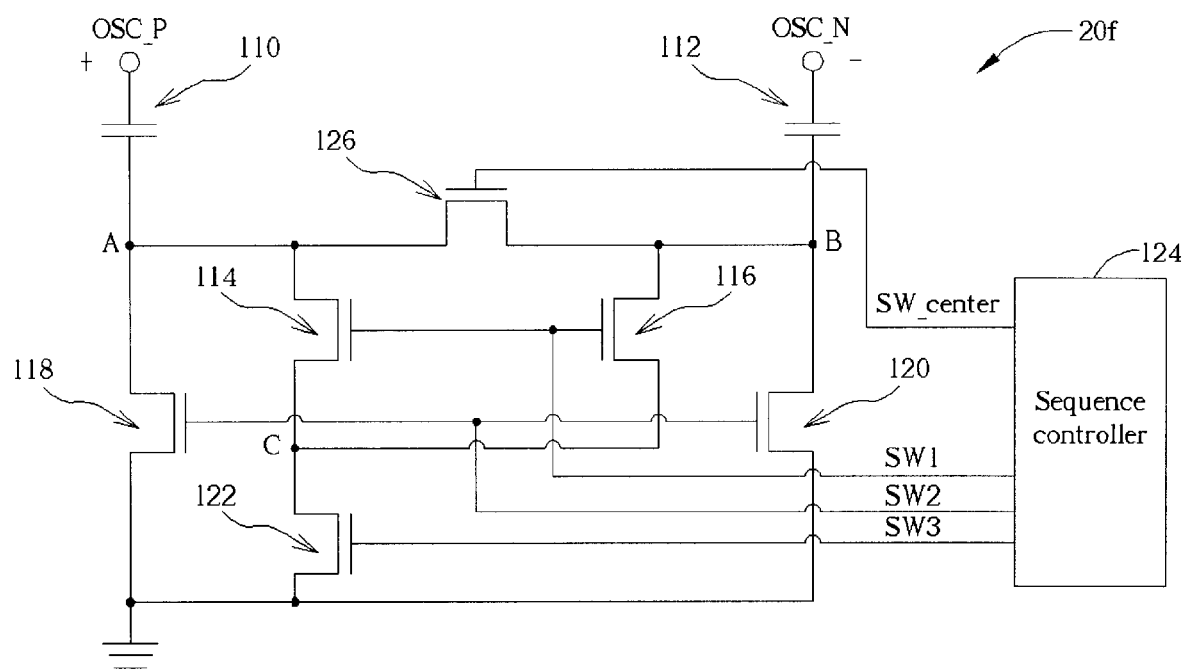
FIG. 11 is a third embodiment differential type switched capacitor circuit 20f according to the present invention.

FIG. 11 shows a third embodiment differential type switched capacitor circuit 20f according to the present invention. In FIG. 11, the switched capacitor circuit 20f comprises a positive side capacitor 110, a negative side capacitor 112, a first positive side switch element 114, a first negative side switch element 116, a second positive side switch element 118, a second negative side switch element 120, a third switch element 122, a center switch element 126, and a sequence controller 124. In the third element, the switch elements are NMOS transistors, the first positive side switch element 114 and the first negative side switch element 116 being of substantially the same size and larger than the second positive side switch element 118 and the second negative side switch element 120, which are also of substantially the same size. Additionally, the third switch element 122 is substantially the same size as the second positive and negative side switch elements 118, 120; and the center switch element 126 is larger than the first positive side switch element 114 and the first negative side switch element 116. The positive side capacitor 110 is connected between the first oscillator node OSC_P and a node A. The negative side capacitor 112 is connected between the second oscillator node OSC_N and a node B. The center switch element 126 selectively connects node A to node B depending on a center control signal SW_center. The first positive side switch element 114 selectively connects node A to node C depending on a first control signal SW1. The first negative side switch element 116 selectively connects node B to node C depending on the first control signal SW1. The second positive side switch element 118 selectively connects node A to ground depending on the second control signal SW2, and the second negative side switch element 120 selectively connects node B to ground depending on the second control signal SW2. The third switch element 122 selectively connects node C to ground depending on a third control signal SW3. Finally, the sequence controller 124 generates the first, second, and third control signals SW1, SW2, SW3 as well as the center control signal SW_center.

Figure 12:
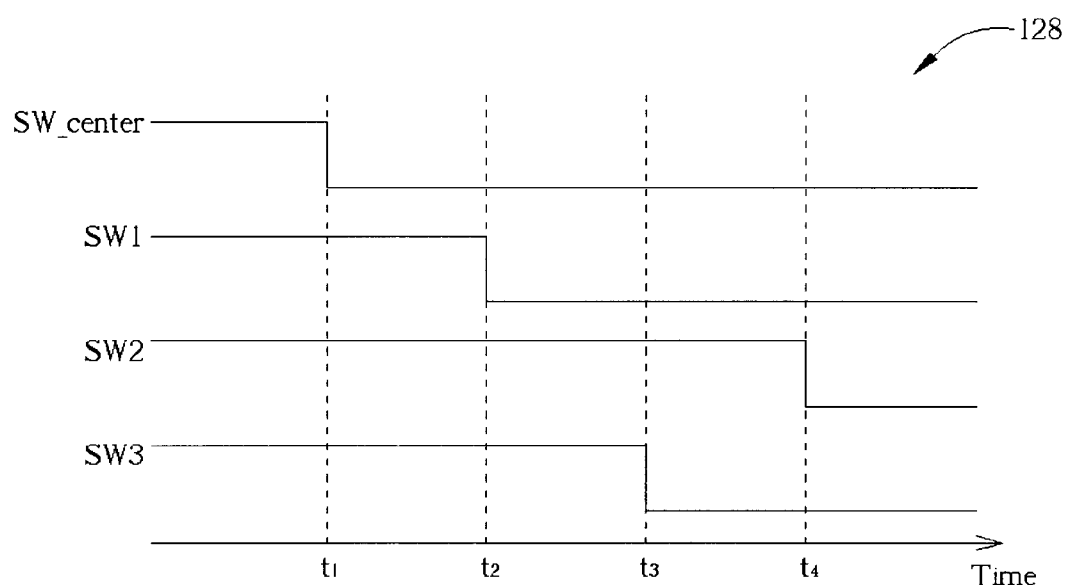
FIG. 12 is a time domain plot of the control signals generated by the sequence controller of FIG. 11.

FIG. 12 shows a time domain plot 128 of the control signals generated by the sequence controller 124. In order to gradually switch the switched capacitor circuit 20f to an off state, the sequence controller 124 ensures that the center switch element 126 is switched off first at time $t_1$. The first positive and negative switch elements 114, 116 are switched off next at time $t_2$. To further prevent any subthesbold and leakage currents from passing through the first positive and negative side switch elements 114, 116 when node A and node B is not connected to ground, the third switch element 122 is switched off next at time $t_3$. After the first positive and negative side switch elements 114, 116 have been disconnected from ground by the third switch element 122, the second positive and negative side switch elements 118, 120 are switched off at time $t_4$. It should be noted that although FIG. 11 includes the center switch element 126 and the sequence controller 124 generates the center control signal SW_center, the center switch element is an optional component used to lower the overall turn-on switch resistance. Without the center switch element 126, the switched capacitor circuit 20f is itself another embodiment of the differential type switched capacitor circuit.

Additionally, there are three different combinations for the turn off timing $t_3$ and $t_4$ for the second and third positive/negative side switch elements. Time $t_3$ can lead, lag or be equal to the time $t_4$. For each combination, a low pass filter can be added at the switch control signals SW2 and SW3 to minimize the clock feedthrough effect caused by the corresponding switches themselves.

Figure 13:
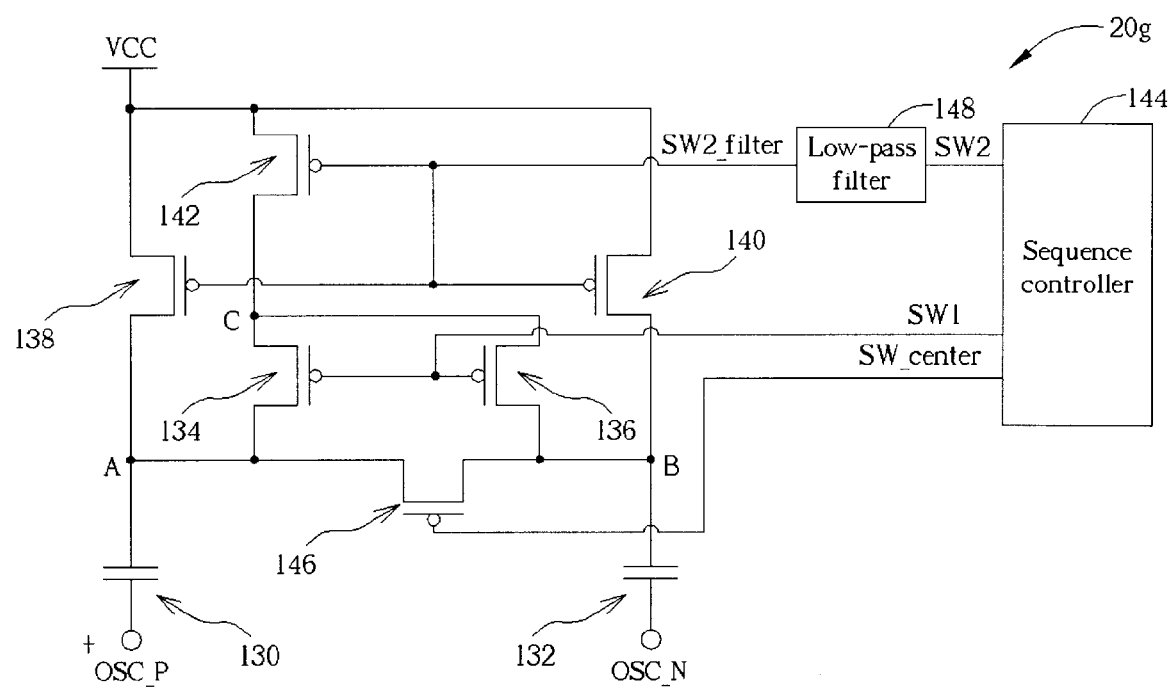
FIG. 13 is a fourth embodiment differential type switched capacitor circuit according to the present invention.

FIG. 13 shows a fourth embodiment differential type switched capacitor circuit 20g according to the present invention. In FIG. 13, the switched capacitor circuit 20g comprises a positive side capacitor 130, a negative side capacitor 132, a first positive side switch element 134, a first negative side switch element 136, a second positive side switch element 138, a second negative side switch element 140, a third switch element 142, a center switch element 146, a low-pass filter 148, and a sequence controller 144. In the fourth embodiment, the switch elements are PMOS transistors, the first positive side switch element 134 and the first negative side switch element 136 being of substantially the same size and larger than the second positive side switch element 138 and the second negative side switch element 140, which are also of substantially the same size. Additionally, the third switch element 142 is of substantially the same size as the second positive and negative side switch elements 138, 140; and the center switch element 146 is larger than the first positive side switch element 134 and the first negative side switch element 136. The sequence controller 144 generates a center control signal SW_center, a first control signal SW1, and a second control signal SW2. The second control signal is connected to the input of the low-pass filter 148 and the output of the low-pass filter is a filtered version of the second control signal SW2_filter. The positive side capacitor 130 is connected between the first oscillator node OSC_P and a node A. The negative side capacitor 132 is connected between the second oscillator node OSC_N and a node B. The center switch element 146 selectively connects node A to node B depending on a center control signal SW_center. The first positive side switch element 134 selectively connects node A to node C depending on a first control signal SW1. The first negative side switch element 136 selectively connects node B to node C depending on the first control signal SW1. The second positive side switch element 138 selectively connects node A to a VCC power supply node depending on the filtered control signal SW_filter, and the second negative side switch element 140 selectively connects node B to the VCC power supply node depending on the filtered control signal SW_filter. Finally, the third switch element 142 selectively connects node C to the VCC power supply node depending on the filtered control signal SW_fitler.

Like the NMOS-based switch of FIG. 11, the sequence controller can also generate 4 control signals for: the center switch element 146, the first positive/negative side switch elements, the second positive/negative side switch elements, and the third switch element. The second positive/negative side switch elements and the third switch element can have the aforementioned turn off timing combinations and can further include a low pass filter connected to the control signals to minimize the clock feedthrough effect.

Figure 14:
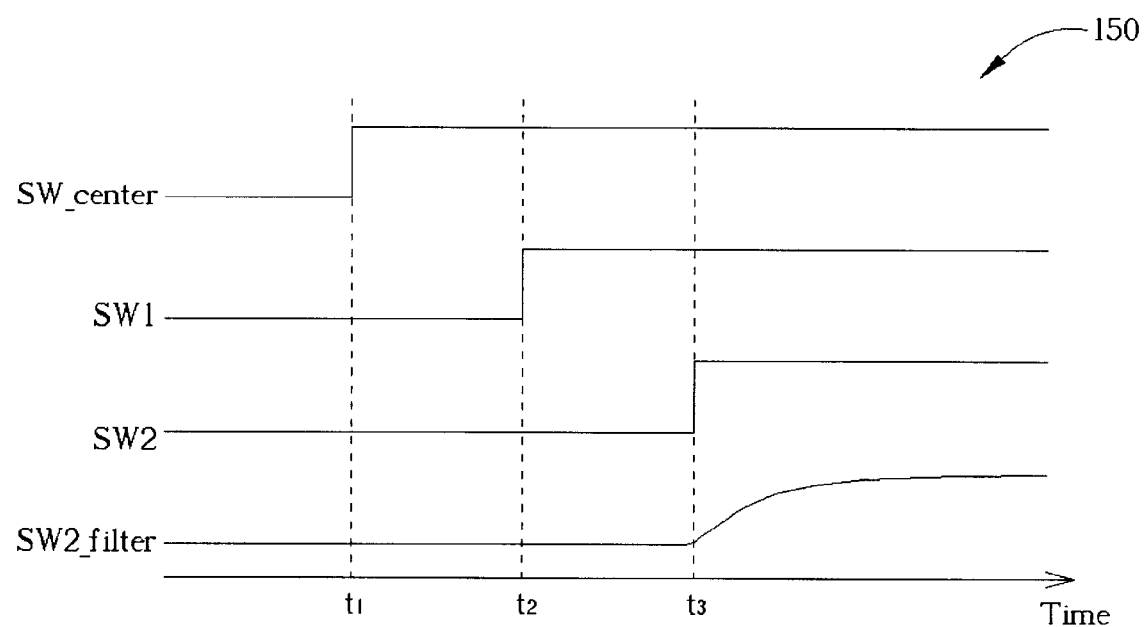
FIG. 14 is a time domain plot of the control signals generated by the sequence controller of FIG. 13.

FIG. 14 shows a time domain plot 150 of the control signals generated by the sequence controller 144. In order to gradually switch the switched capacitor circuit 20g to an off state, the sequence controller 144 ensures that the center switch element 146 is switched off first at time $t_1$. The first positive and negative switch elements 134, 136 are switched off next at time $t_2$. To prevent any subthreshold and leakage currents from passing through the first positive and negative side switch elements 134, 136 when node A and node B are not connected to ground, the third switch element 142, and the second positive and negative side switch elements 138, 140 are switched off next at time $t_3$ using the filtered control signal SW2_filter. It should be noted that although FIG. 13 includes the center switch element 146 and the sequence controller 144 generates the center control signal SW_center, the center switch element is an optional component used to lower the overall turn-on switch resistance of the switched capacitor circuit 20g. Without the center switch element 146, the switched capacitor circuit 20g is itself another embodiment of the differential type switched capacitor circuit.

In contrast to the prior art, the present invention gradually switches off the switched capacitor circuit so that the clock feedthrough effect is minimized and accordingly the undesired frequency drift of the VCO 10 frequency is properly reduced. When switching off, the prior art implementations suffer from clock feedthrough effect that causes a voltage step change to occur at an internal capacitive node of the VCO 10 resonator. The voltage step change causes the junction diode formed by a switch element in the off state to be slightly forward biased until the dropped voltage returns to the ground potential. According to the present invention, the voltage step change at the internal capacitive node is minimized. When switching off, the present invention minimizes the momentary change of the capacitance value of the VCO 10 resonator and the momentary drift in the VCO 10 frequency. Additionally, the subthreshold and leakage currents passing through the largest switch elements are blocked by the use of an additional switch element. The additional switch element effectively isolates the largest switch element having the largest subthreshold and leakage currents from a ground or power supply node. This further stabilizes the voltage change at node A during the synthesizer locking period, allowing the VCO 10 frequency to be locked faster than the prior art.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A switched capacitor circuit capable of minimizing clock feedthrough effect comprising:

a first positive side switch element for selectively connecting a first positive side node to a third node depending upon a first control signal, wherein the first positive side node is connected to a positive side capacitor;

a second positive side switch element for selectively connecting the first positive side node to a second node depending upon a second control signal;

a third switch element for selectively connecting the third node to the second node depending upon a third control signal; and a sequence controller connected to the switch elements for generating the first control signal, the second control signal, and the third control signal.

2. The switched capacitor circuit of claim 1, wherein the first positive side switch element is larger than the second positive side switch element.

3. The switched capacitor circuit of claim 1, wherein the first positive side switch element is larger in size than the second positive side switch element, the second positive side switch element is larger in size than the third switch element, and the sequence controller switches off the switch elements sequentially in an order of decreasing size.

4. The switched capacitor circuit of claim 1, wherein the second positive side switch element and the third switch element are substantially the same size.

5. The switched capacitor circuit of claim 1, further comprising a means for making at least the second positive switch element or the third switch element gradually switch off.

6. The switched capacitor circuit of claim 5, wherein each switch element comprises a transistor, and the means for making the second positive switch element or the third switch element gradually switch off comprises a low-pass filter connected to a control terminal of the second positive switch element or the third switch element.

7. The switched capacitor circuit of claim 1, wherein the second node is ground and the switch elements comprise NMOS transistors.

8. The switched capacitor circuit of claim 1, wherein the second node is a DC power supply node and the switch elements comprise PMOS transistors.

9. The switched capacitor circuit of claim 1, further comprising:

a first negative side switch element for selectively connecting a first negative side node to the third node depending upon the first control signal, wherein the first negative side node is connected to a negative side capacitor; and a second negative side switch element for selectively connecting the first negative side node to the second node depending upon the second control signal.

10. The switched capacitor circuit of claim 9, wherein:

the first negative side switch element is substantially the same size as the first positive side switch element; and the second negative side switch element is substantially the same size as the second positive side switch element.

11. The switched capacitor circuit of claim 9, further comprising:

a center switch element for selectively connecting the first positive side node to the first negative side node depending upon a center control signal;

wherein the sequence controller is further connected to the center switch element for generating the center control signal.

12. The switched capacitor circuit of claim 11, wherein the center switch element is larger than the first positive side switch element and the first negative side switch element.

13. The switched capacitor circuit of claim 11, wherein the first positive side switch element is larger in size than the second positive side switch element, the second positive side switch element is larger in size than the third switch element, the first negative side switch element is substantially the same size as the first positive side switch element, the second negative side switch element is substantially the same size as the second positive side switch element, and the sequence controller first switches off the center switch element and then switches off the positive and negative side switch elements sequentially in an order of decreasing size.

14. A method for minimizing clock feedthrough effect when switching off a switched capacitor circuit, the method comprising the following steps:

(a) disconnecting a first positive side node from a third node through a first positive side switch element;

(b) disconnecting the first positive side node from a second node through a second positive switch element; and (c) disconnecting the third node from the second node through a third switch positive side element;

wherein the first positive side node is connected to a positive side capacitor.

15. The method of claim 14, wherein the first positive side switch element is larger than the second positive side switch element.

16. The method of claim 14, wherein the second positive side switch element and the third switch element are substantially the same size.

17. The method of claim 14, wherein step (a) precedes steps (b) and (c).

18. The method of claim 14, further comprising making at least the second positive switch element or the third switch element gradually switch off.

19. The method of claim 18, wherein each switch element comprises a transistor, and making the second positive switch element or the third switch element gradually switch off comprises adding a low-pass filter to a control terminal of the second positive switch element or the third switch element.

20. The method of claim 14, wherein the second node is ground and the switch elements comprise NMOS transistors.

21. The method of claim 14, wherein the second node is a DC power supply node and the switch elements comprise PMOS transistors.

22. The method of claim 14, further comprising the following steps:

(d) disconnecting a first negative side node from the third node through a first negative side switch element; and (e) disconnecting the first negative side node from the second node through a second negative switch element;

wherein the first negative side node is connected to a negative side capacitor.

23. The method of claim 22, wherein:

the first negative side switch element is substantially the same size as the first positive side switch element; and the second negative side switch element is substantially the same size as the second positive side switch element.

24. The method of claim 22, wherein step (a) and step (d) are performed at the same time, and wherein step (b) and step (e) are performed at the same time.

25. The method of claim 22, further comprising the following steps:

(f) disconnecting the first positive side node from the first negative side node through a center switch element.

26. The method of claim 25, wherein the center switch element is larger than the first positive side switch element and the first negative side switch element.

27. The method of claim 25, wherein step (f) precedes step (a).

28. The switched capacitor circuit of claim 1, wherein the first positive side switch element is larger in size than both the second positive side switch element and the second third switch element, and the sequence controller first switches off the first positive side switch element.

29. The switched capacitor circuit of claim 11, wherein the first positive side switch element is larger in size than both the second positive side switch element and the third switch element, the first negative side switch element is substantially the same size as the first positive side switch element, the second negative side switch element is substantially the same size as the second positive side switch element, and the sequence controller first switches off the center switch element and then switches off the positive and negative side first switch elements.

* * * * *